United States Patent [19]

Toshimitsu et al.

[11] Patent Number: 5,416,673
[45] Date of Patent: May 16, 1995

[54] MOUNTING STRUCTURE FOR EMI PREVENTION FILTER

[75] Inventors: Kenji Toshimitsu; Kazuaki Kashiwada; Mitsuo Kaetsu, all of Kawasaki, Japan

[73] Assignee: Fujitsu Limited, Kawasaki, Japan

[21] Appl. No.: 186,865

[22] Filed: Jan. 27, 1994

[30] Foreign Application Priority Data

Sep. 7, 1993 [JP] Japan .................................. 5-221853

[51] Int. Cl.6 .............................................. H05K 7/02
[52] U.S. Cl. .................... 361/809; 361/752; 361/794; 361/818; 174/35 R
[58] Field of Search ............... 361/748, 752, 794, 796, 361/807, 809, 818, 816; 174/52.4, 59, 35 R, 35 C; 248/612, 614

[56] References Cited

U.S. PATENT DOCUMENTS 4,922,199 5/1990 Fukui et al. .................... 324/207.17
5,278,728 1/1994 Blankenship et al. ............. 361/807

*Primary Examiner*—Leo P. Picard
*Assistant Examiner*—Young Whang
*Attorney, Agent, or Firm*—Armstrong, Westerman, Hattori, McLeland & Naughton

[57] ABSTRACT

A mounting structure for an EMI prevention filter which facilitates mounting and dismounting of the EMI prevention filter onto and from an electric wire having a connector to be releasably connected to an electronic apparatus, and which allows reliable mounting of the EMI prevention filter even where the EMI prevention filter and an object electric wire do not conform fully to each other in configuration. An outer holder in which the EMI prevent filter is accommodated is disposed such that the electric wire extends through the inside thereof, and the, the outer holder is resiliently deformed and locked in this condition, where after a second threaded portion is screwed with a first threaded portion to mount the EMI prevention filter onto the electric wire.

3 Claims, 5 Drawing Sheets

MOUNTING STRUCTURE FOR EMI PREVENTION FILTER

BACKGROUND OF THE INVENTION

1. Field of the Invention

This invention relates to a structure for mounting an EMI prevention filter onto an electric wire.

2. Description of the Related Art

In recent years, in the field of electronic apparatus such as communication apparatus, an increase in amount and speed of information to be processed has increased remarkably,.and EMI (Electromagnetic Interference) caused by electromagnetic waves radiated from or admitted into such electronic apparatus makes a problem. Therefore, various countermeasures for prevention of electromagnetic waves are provided for such apparatus themselves, and in order to prevent electromagnetic waves from entering into or being radiated from an electronic apparatus by way of an electric wire connected to the electronic apparatus, an EMI prevention filter is mounted on the electric wire. Such EMI prevention filter is constituted from, for example, a pair of core members having such shapes as are obtained by dividing a cylinder along a plane passing an axial line of the cylinder. The inner diameter of a core constituted from the core members is substantially equal to the diameter of the electric wire on which the core is to be mounted. The core is made of a metal depending upon an applicable frequency or the like, such as, for example, ferrite.

In one of known mounting structures for an EMI prevention filter, such a pair of core members as described above are disposed in the proximity of a connector to an electronic apparatus provided at an end portion of an object electric wire in such a manner as to hold the electric wire from the opposite sides and are banded to the electric wire, for example, using a nylon band to mount the core onto the electric wire. In another known mounting structure for an EMI prevention filter, such a pair of core members as described above are hinged at side edge portions thereof for pivotal motion relative to each other while locking means are provided on the other side edge portions, and an object electric wire is held from the opposite sides thereof in a similar manner by and between the core members and the core members are locked by the locking means to mount the core onto the electric wire.

However, since the diameter of an electric wire onto which an EMI prevention filter is to be mounted has a wide variety of values, the configuration of an EMI prevention filter prepared in advance may not sometimes conform to that of an object electric wire. In such an instance, where the EMI prevention filter has any of such conventional structures as described above, it may be difficult to mount the EMI prevention filter onto the electric wire or the EMI prevention filter may be dislocated on or may drop from the electric wire as time passes. Consequently, the conventional mounting structures for an EMI prevention filter is low in reliability. Further, in order to prevent EMI, an EMI prevention filter to be mounted must necessarily have a characteristic which matches with a frequency of electromagnetic waves which may be radiated from or enter into the electric apparatus. However, since mounting of an EMI prevention filter is performed in a trial and error fashion at a site, that is, in an office, a factory or the like in which the electronic apparatus is installed, the EMI prevention filter is required to be mounted and dismounted easily. Further, even when an EMI prevention filter is to be replaced with another EMI prevention filter of a different profile, such replacement should be performed readily.

SUMMARY OF THE INVENTION

Accordingly, it is an object of the present invention to provide a mounting structure for an EMI prevention filter which facilitates mounting and dismounting of the EMI prevention filter onto and from an electric wire.

It is another object of the present invention to provide a mounting structure for an EMI prevention filter which allows reliable mounting of the EMI prevention filter even where the EMI prevention filter and an object electric wire do not conform fully to each other in configuration.

In accordance with an aspect of the present invention, there is provided a structure for mounting an electromagnetic interference prevention filter onto an electric wire having a connector to be removably connected to an electronic apparatus, which comprises a protective cover for protecting connection portions of the connector and the electric wire, the protective cover having a first threaded portion formed in the proximity of a portion thereof, at which the electric wire enters the protective cover, in such a manner as to surround the electric wire, an outer holder formed from an elastic member having a large diameter portion for accommodating the electromagnetic interference prevention filter in the inside thereof and a small diameter portion formed integrally and in a coaxially relationship with the large diameter portion, the outer holder having a profile obtained by cutting away a portion of a side wall of a member having a substantially cylindrical profile along the axial direction, the outer holder having a second threaded portion formed on the small diameter portion and screwed with the first threaded portion of the protective cover while the outer holder is resiliently deformed so as to contact the opposing opposite end portions thereof with each other, and locking means for releasably locking the outer holder in the condition wherein the outer holder is resiliently deformed so as to contact the opposing opposite end portions thereof with each other.

Preferably, the outer holder further has a threaded hole formed in the large diameter portion thereof in such a manner as to extend between the outside and the inside of the large diameter portion, and the structure for mounting an electromagnetic interference prevention filter further comprises a filter fixing screw threaded into the threaded hole from the outside of the outer holder. The structure for mounting an electromagnetic interference prevention filter may further comprise an inner holder mounted for turning portion in the proximity of an end of the filter fixing screw for fixing the electromagnetic interference prevention filter.

In the structure for mounting an electromagnetic interference prevention filter according to the present invention, in order to mount the EMI prevention filter onto the electric wire, the EMI prevention filter disposed in such a manner as to surround the electric wire is accommodated into the large diameter portion of the outer holder, and the outer holder is disposed such that the electric wire extends through the large diameter portion and the small diameter portion of the outer holder. Then, the outer holder is resiliently deformed to close the opening portion of the outer holder, and in this condition, the outer holder is locked by means of the locking means. Subsequently, the outer holder is turned to screw the second threaded portion formed on the small diameter portion of the outer holder with the first threaded portion of the protective cover to fix the outer holder to the connector, thereby to complete the mounting operation of the EMI prevention filter. In order to remove the EMI prevention filter, the process described above is performed in the reverse procedure. In this manner, the mounting or dismounting operation of the EMI prevention filter can be performed very readily.

Where the structure for mounting an electromagnetic interference prevention filter further comprises the filter fixing screw and/or the inner holder described above, by tightening the filter fixing screw after the outer holder is fixed to the connector, the EMI prevention filter in the inside of the large diameter portion of the outer holder is pressed by an end of the filter fixing screw or the inner holder, and consequently, the present EMI prevention filter mounting structure can cope flexibly with various EMI prevention filters having various profiles. Further, even where the EMI prevention filter and the electric wire do not conform to each other a little in configuration, the EMI prevention filter can be fixed with certainty to the electric wire.

The above and other objects, features and advantages of the present invention and the manner of realizing them will become apparent, and the invention itself will be understood, from a study of the following description and appended claims with reference to the attached drawings showing a preferred embodiment of the present invention.

DESCRIPTION OF THE PREFERRED EMBODIMENT

Figure 1:
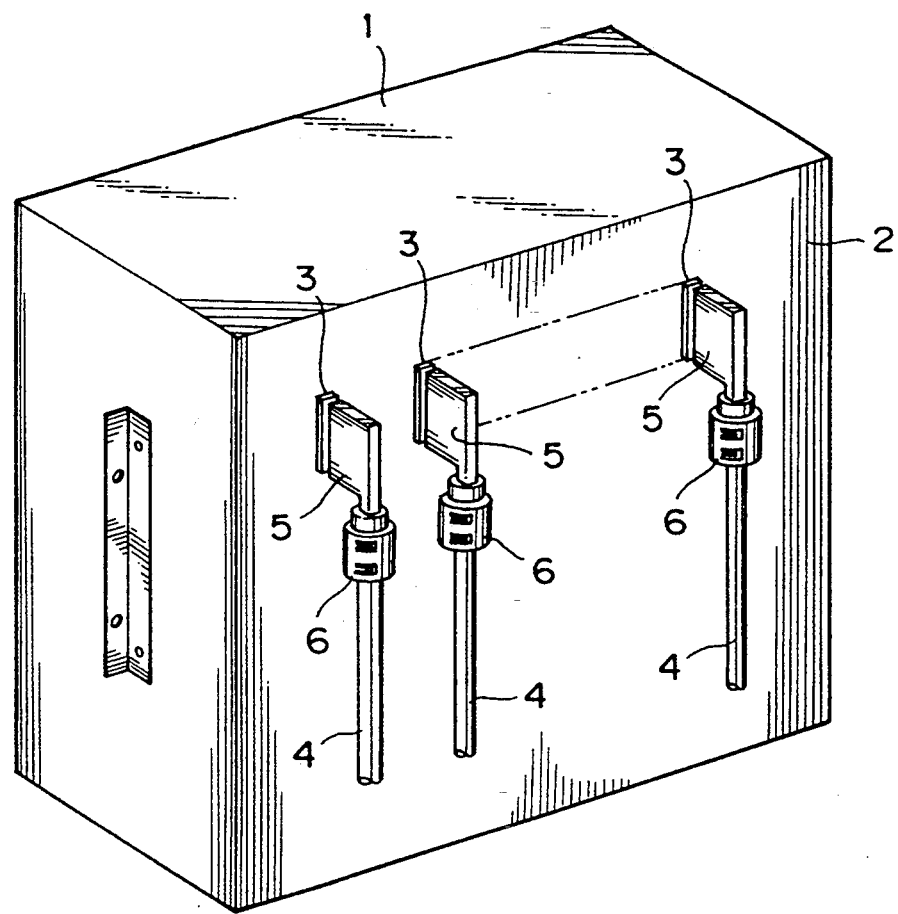
FIG. 1 is a perspective view showing a general construction of an embodiment of the present invention.
Figure 2:
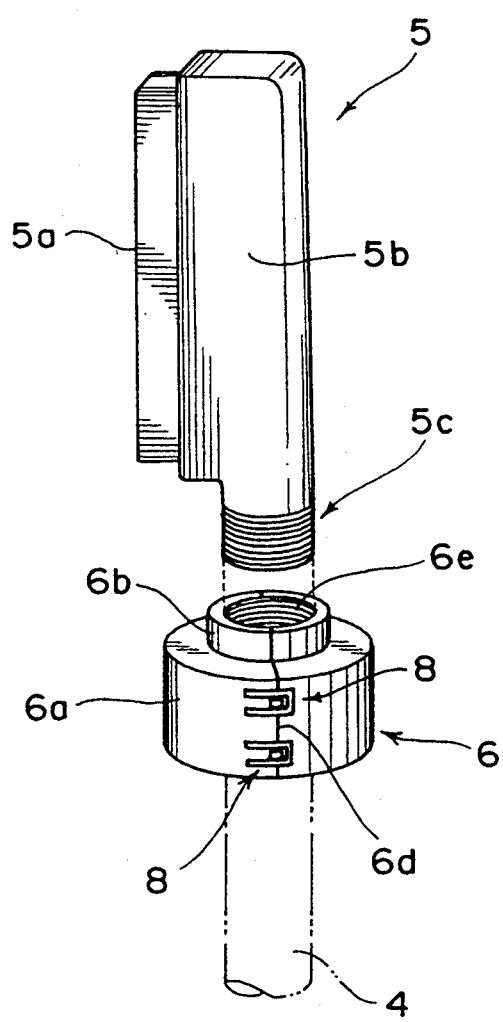
FIG. 2 is an enlarged perspective view showing an end portion of an electric wire in the embodiment of the present invention.

Referring first to FIGS. 1 and 2, reference numeral 1 denotes an electronic apparatus such as a communication apparatus, and a plurality of connectors 3 for connection of electric wires are disposed on a back board 2 of the electronic apparatus 1. Reference numeral 4 denotes an electric wire for connection to another apparatus or the like, and a connector 5 adapted to be removably fitted with and connected to a connector 3 of the electronic apparatus 1 is mounted at an end of the electric wire 4. The connector 5 of the electric wire 4 is constituted from a connector body 5a for being directly fitted with and connected to a connector 3 of the back board 2, and a cover 5b for protecting electric connection portions of the electric wire 4 and the connector body 5a. An outer holder 6 is mounted on each electric wire 4, and an EMI prevention filter is accommodated in the inside of the outer holder 6 for preventing admission or radiation of unnecessary electromagnetic waves by way of the electric wire 4. A portion of the cover 5b of the connector 5 in the proximity of a location at which the electric wire 4 enters into the connector 5 has such a cylindrical profile that it surrounds the electric wire 4, and threads are formed on an outer periphery of the portion of the cover 5b of the connector 5 to form a first threaded portion 5c.

Figure 3A:
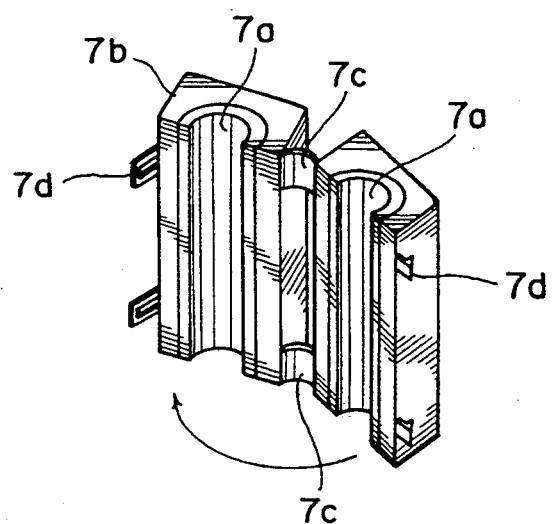
FIG. 3A is a perspective view of an EMI prevention filter in an unlocked condition of the embodiment of the present invention.
Figure 3B:
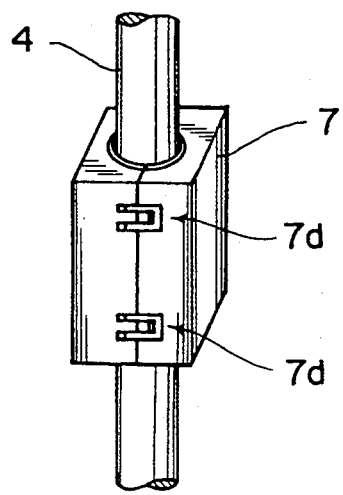
FIG. 3B is a perspective view of the EMI prevention filter of the embodiment of the present invention when it is preliminarily mounted on the electric wire.

The EMI prevention filter employed in the present embodiment includes a pair of core members 7a of such configurations as are obtained by dividing a cylindrical member made of a metal such as ferrite along a plane passing an axial line of the cylindrical member as shown in FIG. 3A, and a plastic case 7b in which the core members 7a are accommodated. The case 7b is constructed for opening and closing movement by means of a pair of hinges 7c and can be fixed in the closed condition by means of locking means 7d. As shown in FIG. 3B, the EMI prevention filter 7 constructed in such a manner as described above is preliminarily mounted onto the electric wire 4 by fixing the same by means of the locking means 7d in a condition wherein it is disposed such that, in a condition wherein the case 7b is closed, the electric wire 4 extends through the center of the EMI prevention filter 7, that is, the core members 7a surround the outer periphery of a portion of the electric wire 4.

Figure 4A:
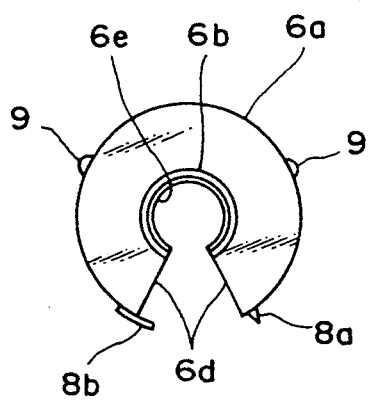
FIG. 4A is a plan view of an outer holder in the unlocked condition of the embodiment of the present invention.
Figure 4C:
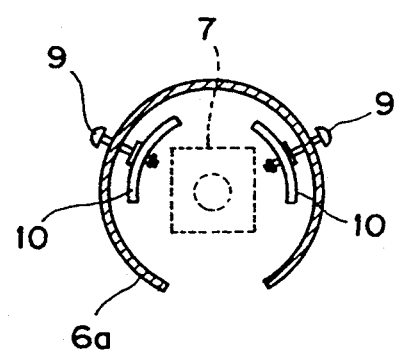
FIG. 4C is a sectional view of the outer holder in the unlocked condition of the embodiment of the present invention.
Figure 4B:
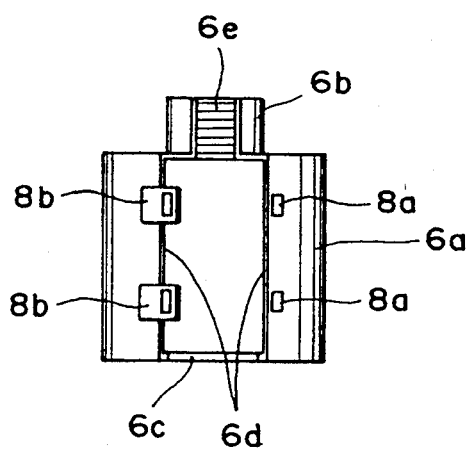
FIG. 4B is a front elevational view of the outer holder in the unlocked condition of the embodiment of the present invention.
Figure 4D:
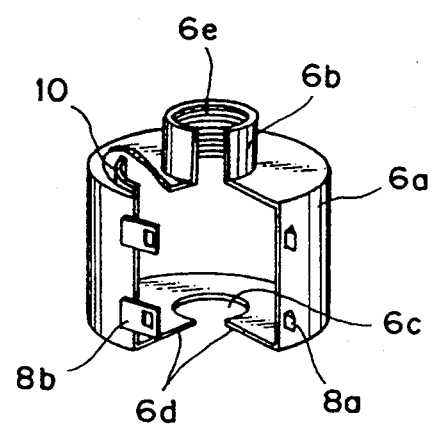
FIG. 4D is a perspective view partly in section of the outer holder in the unlocked condition of the embodiment of the present invention.
Figure 5A:
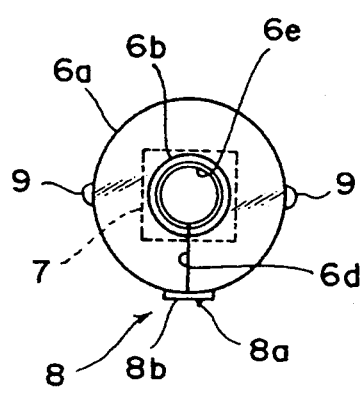
FIG. 5A is a plan view of the outer holder in a locked condition of the embodiment of the present invention.
Figure 5C:
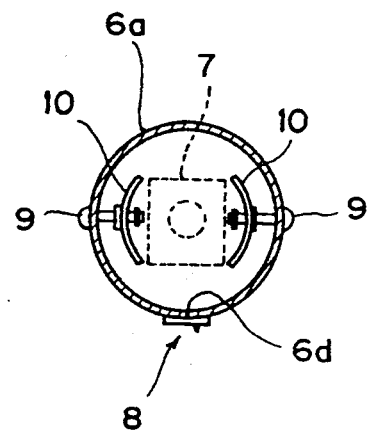
FIG. 5C is a sectional view of the outer holder in the locked condition of the embodiment of the present invention.
Figure 5B:
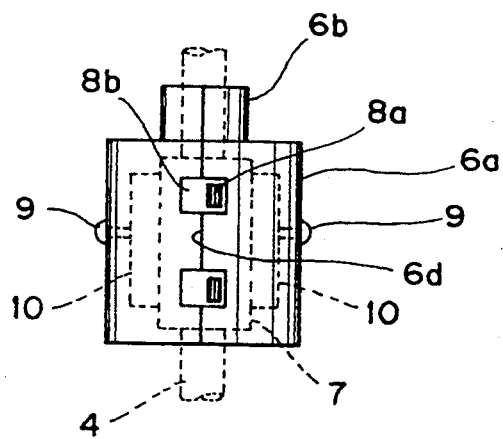
FIG. 5B is a front elevational view of the outer holder in the locked condition of the embodiment of the present invention.

Details of the outer holder 6 in which the EMI prevention filter 7 having the construction described above is accommodated will be described with reference to FIGS. 4A to 4D and 5A to 5C. As shown in FIGS. 4A to 4D, the outer holder 6 is constituted from a resilient member having such a profile as is obtained by cutting away part of a side wall of a substantially tubular member, which has a large diameter portion 6a for accommodating the EMI prevention filter 7 therein and a small diameter portion 6b provided integrally and substantially coaxially with the large diameter portion 6a, radially over a predetermined angle along the axial direction. Further, in order to allow the electric wire 4 to extend through the outer holder 6, upper and lower walls of the small diameter portion 6b of the outer holder 6 are opened, and a through-hole 6c is perforated in a portion of a lower wall of the large diameter portion 6a. The outer holder 6 has, as shown in FIGS. 5A to 5C, locking means 8 for releasably fixing the outer holder 6 in a condition wherein the opposing opposite end portions 6d of the outer holder 6 are held in engagement with each other in a resiliently deformed condition. The locking means 8 is constituted from a pair of upper and lower pins 8a provided on and extending outwardly from the large diameter portion 6a and a pair of pawls 8b having holes for engaging with the pins 8a.

A second threaded portion 6e is formed on the inner side of the small diameter portion 6b. The second threaded portion 6e is screwed with the first threaded portion 5c of the cover 5b of the connector 5 while the outer holder 6 is resiliently deformed such that the opposing opposite end portions 6d thereof contact with each other. Further, a pair of threaded holes are formed in the large diameter portion 6a of the outer holder 6 such that they extend between the outside and the inside of the large diameter portion 6a, and filter fixing screws 9 are individually screwed in the threaded holes from the outside. Then, as shown in FIGS. 4C, 4D or 5C, an inner holder 10 is mounted for turning motion at an end portion of each of the filter fixing screws 9 by means of a pair of fixing plates. As the filter fixing screws 9 are threaded in, the EMI prevention filter 7 accommodated in the inside of the outer holder 6 is pressed and fixed by the ends of the screws 9 or the inner holders 10.

In order to mount such an EMI prevention filter 7 as shown in FIG. 3A, it is preliminarily mounted onto an electric wire 4 as shown in FIG. 3B, and then, while the locking means 8 of the outer holder 6 is in an unlocking condition and the filter fixing screws 9 are loosened sufficiently, the electric wire 4 is disposed into the large diameter portion 6a of the outer holder 6 in such a manner that it extends through the small diameter portion 6b and the through-hole 6c of the outer holder 6. Then, the outer holder 6 is resiliently deformed as shown in FIGS. 5A to 5C and is fixed in this condition by means of the locking means 8. Thereafter, as shown in FIG. 2, the second threaded portion 6e formed on the small diameter portion 6b of the outer holder 6 is threaded with the first threaded portion 5c of the cover 5b of the connector 5 to fix the outer holder 6 to the cover 5b. In this condition, the filter fixing screws 9 of the outer holder 6 are tightened to fix the EMI prevention filter 7 in the inside of the outer holder 6, thereby completing the mounting operation. As shown in FIG. 1, the electric wire 4 on which the EMI prevention filter 7 is mounted is connected to the electronic apparatus 1 by fitting and connecting the connector 5 of the electric wire 4 with and to one of the connectors 3 of the back board 2 of the electronic apparatus 1.

According to the present embodiment, the electric wire 4 on which the EMI prevention filter 7 is preliminarily mounted is disposed in such a manner that it extends through the large diameter portion 6a and the small diameter portion 6b of the outer holder 6, and then the outer holder 6 is resiliently deformed and is locked in this condition by means of the locking means 8. Subsequently, the outer holder 6 is turned to screw the second threaded portion 6e formed on the small diameter portion 6b with the first threaded portion 5c of the connector 5, and then, when necessary, the filter fixing screws 9 are tightened to mount the EMI prevention filter 7 onto the electric wire 4. In this manner, the mounting operation for the EMI prevention filter 7 is very easy. Since the EMI prevention filter 7 is accommodated in the large diameter portion 6a of the outer holder 6 and the outer holder 6 is screwed with the cover 5b of the connector 5, even where the EMI prevention filter 7 does not match in configuration with the electric wire 4 a little, the position of the EMI prevention filter 7 will not be displaced nor the EMI prevention filter 7 will drop as time passes, and reliable fixation of the EMI prevention filter 7 can be realized. Further, even if the EMI prevention filter 7 is, for example, replaced with a new EMI prevention filter and the new EMI prevention filter is a little different, for example, in size of the outer profile, the new EMI prevention filter can be mounted appropriately by adjustment of the filter fixation screws 9 or the inner holders 10. Consequently, such replacement can be performed flexibly without deterioration of the reliability in mounting.

Since the mounting structure for an EMI prevention filter according to the present invention is constructed in such a manner as described so far, it is advantageous in that an EMI prevention filter can be mounted readily onto an electric wire, and even if they do not conform in configuration a little to each other, the EMI prevention filter can be mounted onto the electric wire with a high degree of reliability. It is another advantage in that the mounting structure for an EMI prevention filter can cope flexibility with a change in profile of the EMI prevention filter.

It is to be noted that the present invention is not limited to the preferred embodiment described above. For example, while such an EMI prevention filter as shown in FIGS. 3A and 3B is taken as an example in the embodiment described above, another EMI prevention filter which only includes a pair of core members may be employed instead. Further, the number of the filter fixing screws 9 is not limited to that of the embodiment described above, but it may be a different plural number. Further, the profile of the inner holders 10 may be modified in accordance with the profile of an EMI prevention filter to be mounted. Accordingly, it should be understood that all alterations and modifications which fall within the spirit and scope of the present invention are included in the claims.

What is claimed is:

1. A structure for mounting an electromagnetic interference prevention filter onto an electric wire having a connector for removably connecting to an electronic apparatus, comprising:
    a protective cover for protecting connection portions of said connector and said electric wire, said protective cover having a first threaded portion formed in the proximity of a portion thereof, at which said electric wire enters said protective cover so as to surround said electric wire;
    an outer holder formed from an elastic member having a large diameter portion for accommodating said electromagnetic interference prevention filter in the inside thereof and a small diameter portion formed integrally and in a coaxially relationship with said large diameter portion, said outer holder having a profile obtained by cutting away a portion of a side wall of a member having a substantially cylindrical profile along the axial direction, said outer holder having a second threaded portion formed on said small diameter portion and screwed with said first threaded portion of said protective cover while said outer holder is resiliently deformed so as to contact the opposing opposite end portions thereof with each other; and
    locking means for releasably locking said outer holder in the condition wherein said outer holder is resiliently deformed so as to contact the opposing opposite end portions thereof with each other.

2. A structure for mounting an electromagnetic interference prevention filter according to claim 1, wherein said outer holder further has a threaded hole formed in said large diameter portion thereof in such a manner as to extend between the outside and the inside of said large diameter portion, and further comprising a filter fixing screw threaded into said threaded hole from the outside of said outer holder.

3. A structure for mounting an electromagnetic interference prevention filter according to claim 2, further comprising an inner holder mounted for turning portion in the proximity of an end of said filter fixing screw for fixing said electromagnetic interference prevention filter.

* * * * *